United States Patent
Galvez et al.

(10) Patent No.: US 8,304,797 B2
(45) Date of Patent: Nov. 6, 2012

(54) LIGHT EMITTING DIODE LIGHT SOURCE HAVING A CERAMIC SUBSTRATE

(75) Inventors: Miguel Galvez, Danvers, MA (US); Victor Perez, Lawrence, MA (US); Kenneth Grossman, Beverly, MA (US); Mary Ann Johnson, Rockport, MA (US)

(73) Assignee: Osram Sylvania Inc., Danvers, MA (US)

( * ) Notice: Subject to any disclaimer, the term of this patent is extended or adjusted under 35 U.S.C. 154(b) by 83 days.

(21) Appl. No.: 12/846,218

(22) Filed: Jul. 29, 2010

(65) Prior Publication Data

US 2012/0025236 A1 Feb. 2, 2012

(51) Int. Cl.
*H01L 33/00* (2010.01)
*F21V 21/00* (2006.01)

(52) U.S. Cl. ........... 257/98; 257/E33.061; 257/E33.056; 362/249.02

(58) Field of Classification Search ............ 257/98, 257/99, E33.061, E33.056; 362/235, 249.02, 362/311.02

See application file for complete search history.

(56) References Cited

U.S. PATENT DOCUMENTS

| | | | |
|---|---|---|---|
| 3,558,974 A | 1/1971 | Stewart | |
| 6,504,179 B1 | 1/2003 | Ellens et al. | |
| 6,531,328 B1 * | 3/2003 | Chen | 438/26 |
| 6,964,877 B2 | 11/2005 | Chen et al. | |
| 6,998,777 B2 | 2/2006 | Suehiro et al. | |
| 7,115,911 B2 | 10/2006 | Chang et al. | |
| 7,115,979 B2 | 10/2006 | Park et al. | |
| 7,279,723 B2 | 10/2007 | Matsumura et al. | |

(Continued)

FOREIGN PATENT DOCUMENTS

DE 102007028120 A1 12/2008

(Continued)

OTHER PUBLICATIONS

CeramCool Ceramic Heat-Sink (found at ceramtec.com/index/products/ceramcool/ceramic-heat-sinks/) Apr. 10, 2010.

(Continued)

*Primary Examiner* — A. Sefer
*Assistant Examiner* — Nikolay Yushin
(74) *Attorney, Agent, or Firm* — Robert F. Clark

(57) ABSTRACT

An LED light source (10) comprises a ceramic substrate (20) with first and second opposed surfaces (30, 40). Pockets (50) are formed in the first surface (30) and each of the pockets includes a bottom (60) and a sidewall or sidewalls (70). A final electrical contact (105) comprised of a first electrically conductive material (57) with a coating of a second electrically conductive material (100) thereover is positioned in each of the pockets (50). An LED (110) is positioned in each of the pockets (50) and affixed to the electrical contact (105) and electrical connections (120), preferably in form of wire bonds, join the LEDs, the electrical connections (120) extending from a first LED (110) to an adjacent electrical contact (105). The ceramic substrate (20) is formed by injection molding a ceramic material and binder to form a green substrate (12) and subsequently sintering the green substrate to form the substrate (20). An LED light (150) can be formed from the LED light source (10) by adding a dome (150) formed of a ceramic material containing therein a homogeneous dispersion of a phosphor material capable of emitting light when excited by the light emitted from the operating LEDs (110).

9 Claims, 4 Drawing Sheets

U.S. PATENT DOCUMENTS

| | | | |
|---|---|---|---|
| 7,582,911 | B2 | 9/2009 | Lynch et al. |
| 7,652,306 | B2 | 1/2010 | Lee et al. |
| 2005/0104503 | A1 | 5/2005 | Ellens et al. |
| 2007/0297108 | A1* | 12/2007 | Collins et al. .................. 361/56 |
| 2008/0054803 | A1* | 3/2008 | Zheng et al. .................. 313/506 |
| 2008/0164487 | A1* | 7/2008 | Liu et al. ........................ 257/99 |
| 2009/0278139 | A1* | 11/2009 | Fjelstad ........................... 257/88 |

FOREIGN PATENT DOCUMENTS

| | | |
|---|---|---|
| JP | 2002-232017 | 8/2002 |
| JP | 2004-022958 | 1/2004 |
| JP | 2004-356344 | 12/2004 |
| KR | 100784573 B1 | 12/2007 |
| WO | 2007052200 A1 | 5/2007 |

OTHER PUBLICATIONS

Abstract JP 2004-356344, Dec. 16, 2004.
Abstract JP 2002-232017, Aug. 16, 2002.
Abstract JP 2004-022958, Jan. 22, 2004.
European Search Report sibling EP2434001 A3 filed on Jun. 21, 2011.

* cited by examiner

LIGHT EMITTING DIODE LIGHT SOURCE HAVING A CERAMIC SUBSTRATE

TECHNICAL FIELD

This invention relates to light emitting diode (LED or LEDs) light sources and more particularly to substrates for mounting LED light sources and domes for disbursing the light emitted by the diodes. Still more particularly it relates to a method for making multi-chip, traceless substrates and domes for LED light sources and to methods for making an LED light source. Additionally, the invention relates to a fully ceramic light source including a dome that is itself a source of light as well as a transmitter of light.

BACKGROUND OF THE INVENTION

The long life and low power requirements of LEDs have made them ideal sources of light in many applications; however, because of their relatively small size it is not unusual for such light sources to include multiple LEDs. In the latter situation it is common to mount a large number of LEDs upon printed circuit boards that utilize a large number of printed traces to make the various electrical connections between the LEDs and a power source. These boards generally are constructed from silicone or plastic materials or metal-cored printed circuit boards (PCBs). The low thermal conductivity of these boards (0.2 W/mK for the silicone or plastic boards; 2-3 W/mK for the metal-cored boards) requires the use of various thermal management devices, in particular heat sinks, to remove the operational heat generated by the LEDs. Removal of this heat is necessary to maintain, as closely as possible, the original parameters of the LEDs. It has been suggested also to employ ceramic substrates having the circuit elements screen-printed thereon. If the board is only partially filled with dies, then non-populated die pads are shorted out to maintain current continuity. While these solutions have provided some benefits, they suffer from relatively high cost and the necessity of employing multiple traces and thermal glues.

SUMMARY OF THE INVENTION

It is, therefore, an object of the invention to obviate at least some of the above enumerated disadvantages of the prior art.

It is another object of the invention to enhance the manufacture of LED substrates.

Yet another object of the invention is the improvement of LED light sources.

Still another object of the invention is the provision of an LED light source whose light output is greater than the light output of the LEDs alone.

These objects are accomplished, in one aspect of the invention, by the provision of a method of making a ceramic substrate for a light-emitting-diode (LED) light source comprising the steps of forming a mixture of a ceramic substrate material and a volatilizable binder; injecting the mixture into a mold cavity to form a green substrate that includes at least two die pads in the shape of pockets formed in a surface of the green substrate, the pockets having a depth less than the thickness of the green substrate; baking the green substrate to remove the volatilizable binder and form a pre-cursor substrate, depositing a metallic paste into each pocket of the pre-cursor substrate; firing the pre-cursor substrate to sinter the material and form the ceramic substrate and form the metallic paste into a first electrically conductive material; and applying a coating of a second electrically conductive material over the first electrically conductive material to form a final electrical contact. The ceramic substrate has a thermal conductivity in the range of 30 W/mK, far greater than the predecessor boards, reducing or eliminating the need for additional heat sinks.

A light-emitting diode light source is constructed by forming a ceramic substrate as described above and depositing an LED on at least some of the final electrical contacts and wire-bonding suitable electrical connectors between the LEDs and the electrical contacts. The ceramic substrate does not require the use of thermal epoxies and the substrate is substantially traceless with wire bonding taking the place of printed wiring and eliminating the need for short-circuiting unused die pads. The traceless nature provides an open circuit topology where multi-electrical circuits can be laid out during wire bonding of the die types, which can include all one color emitting dies or combinations of red, blue and green emitting dies.

The objects are further accomplished by providing a dome or cover for the substrate that is not only a transmitter of the light emitted by the enclosed LEDs, but an additional source of generated light. This is accomplished by incorporating a light-emitting material within the material that forms the dome. The light emitting material converting at least some of the light emitted by the LEDs into light of a different wavelength.

DETAILED DESCRIPTION OF THE INVENTION

Figure 1:
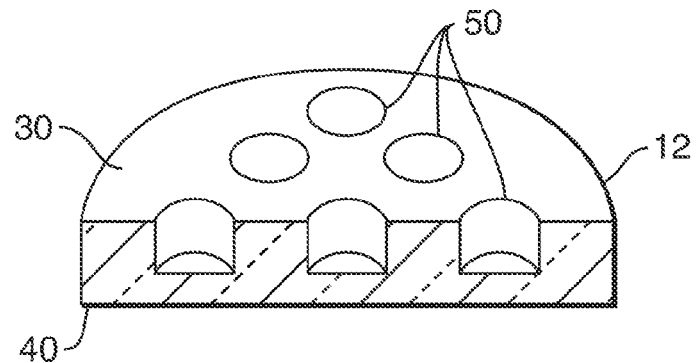
FIG. 1 is a perspective view, partially in section, of a green ceramic substrate in accordance with an aspect of the invention.

For purposes of this application it is to be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. The term "and/or" includes any and all combinations of one or more of the associated listed items.

Although the terms "first," "second," "third" etc. may be used to describe various elements, components, regions, layers and/or sections, these elements, components, regions, layers and/or sections are not to be limited by theses terms as they are used only to distinguish one element, component, region, layer or section from another element, component, region, layer or section. Thus, a first element, component, region, layer or section could be termed a second element, component, region, layer or section without departing from the scope and teachings of the present invention.

Spatially relative terms, such as "beneath," "below," "upper," "lower," "above" and the like may be used herein for ease of description to describe one element or feature's relationship to another element(s) or feature(s) as illustrated in the drawings. These spatially relative terms are intended to encompass different orientations of the device in use or operation in addition to the orientation shown in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 55 degrees or at other orientations) and the spatially relative descriptors used herein interpreted accordingly.

The terminology used herein is for the purpose of describing particular embodiments only and is not intended to be limiting of the invention. For example, as used herein, the singular forms "a," "an" and "the" are intended to include the plural forms as well, unless the context clearly indicates otherwise. It will be further understood that the terms, "comprises" and/or "comprising," when used in this specification, specify the presence of stated features, steps operations, elements, and/or components, but do not preclude the presence or addition of one or more other features, steps, operations, elements, components, and/or groups thereof.

As used herein the term "ceramic" relates to inorganic, non-metallic solids prepared by the action of heat and subsequent cooling and is restricted to those materials having a crystalline or partly crystalline structure and does not include those amorphous substances more commonly including the various glasses.

For a better understanding of the present invention, together with other and further objects, advantages and capabilities thereof, reference is made to the following disclosure and appended claims taken in conjunction with the above-described drawings.

Figure 3:
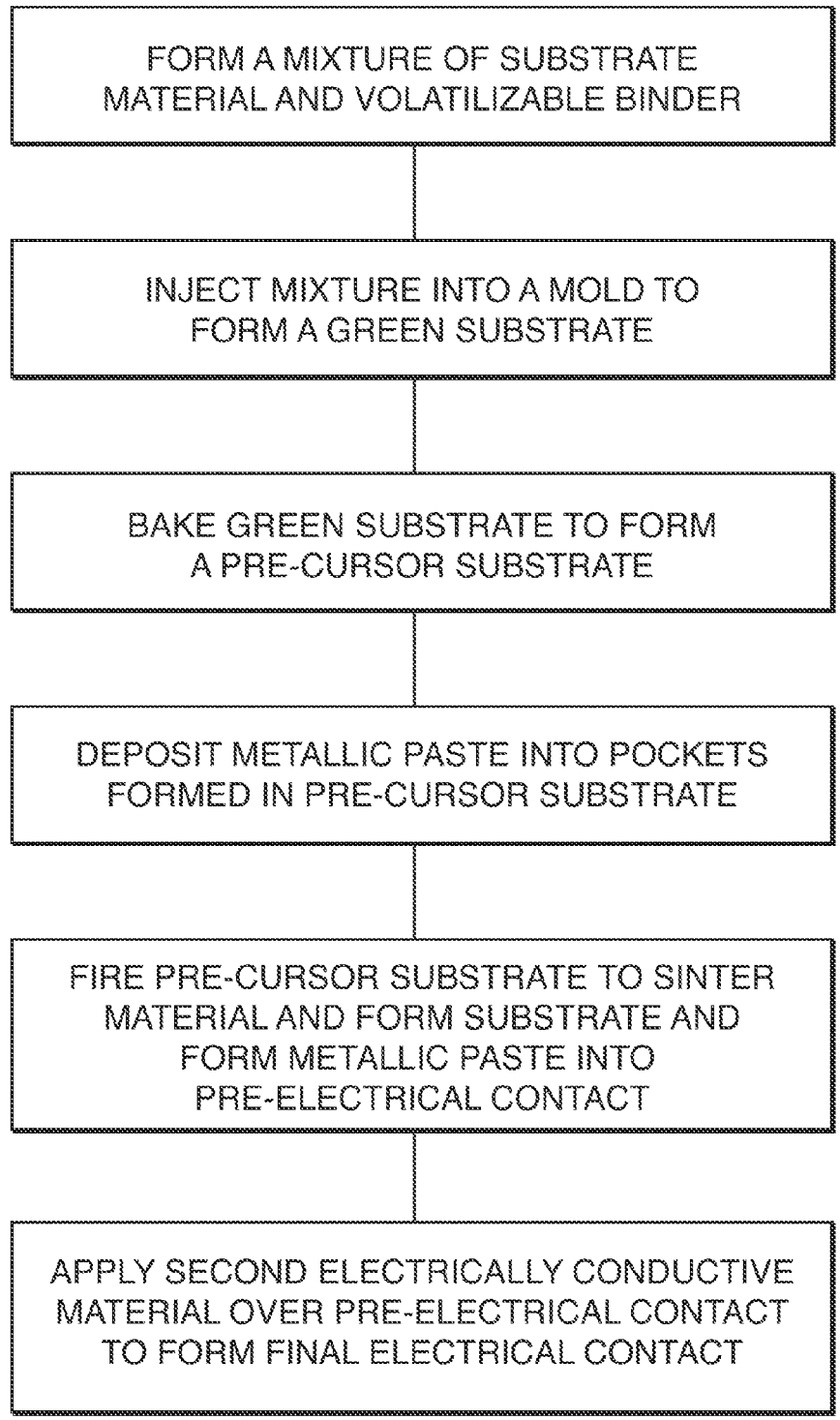
FIG. 3 is a flow diagram of steps utilized in an aspect of a method of the invention.

Referring now to the drawings with greater particularity, there is shown in FIG. 3 a flow diagram illustrating some of the steps involved in the manufacture of a substrate according to an aspect of the invention. The method of making a substrate for a light-emitting-diode (LED) light source 10 comprises the steps of forming a mixture of a ceramic substrate material and a volatilizable binder. Suitable ceramic materials include aluminum oxide ($Al_2O_3$) and aluminum nitride (AlN) with ceramic substrates in the form of polycrystalline alumina (PCA) being preferred. These materials provide high thermal conductivity (30 W/mK) and substrates can easily be made therefrom by injection molding techniques. Suitable binder materials include wax and oleic acid, for example.

The mixture is injected into a mold cavity to form a green substrate 12 that has two surfaces 30 and 40 (FIG. 1) and includes at least two pockets 50 (preferably more than two) formed in a surface (for example, surface 30) of the green substrate 12, the pockets having a depth less than the thickness of the green substrate 12. While the green substrate 12 can have any geometric shape, a circular configuration is shown in FIG. 1, by way of example.

After removal from the mold the green substrate 12 is baked at a temperature of 315° C. for at least 12 hours to remove the volatilizable binder and form a pre-cursor substrate 14.

Figure 7:
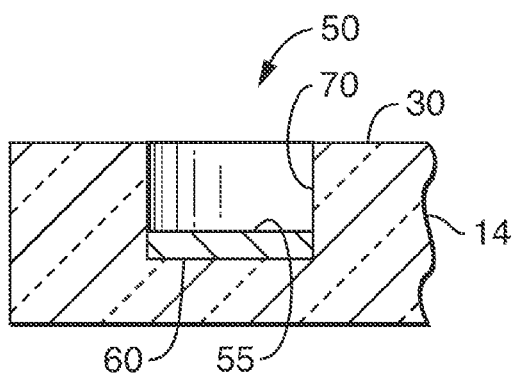
FIG. 7 is a partial, sectional view illustrating the insertion of a metallic paste.

A quantity of a metallic paste 55 (as shown in FIG. 7) capable of withstanding subsequent sintering temperatures is deposited on the bottom 60 of each pocket 50 of the pre-cursor substrate 14. A suitable metallic paste is powdered tungsten with a binder of alpha terpineol.

Figure 6:
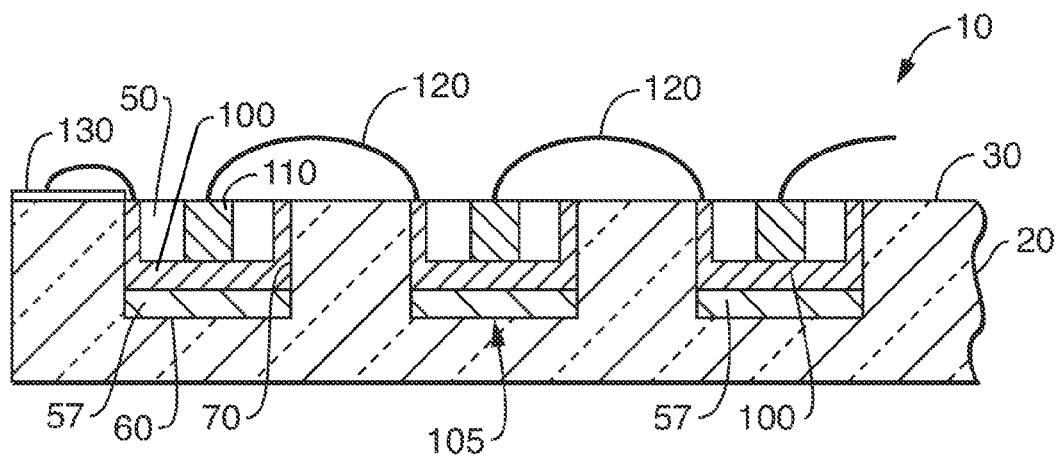
FIG. 6 is a sectional view similar to FIG. 2 illustrating an alternate embodiment.

The pre-cursor substrate 14 is then fired to sinter the material and form a substrate 20 and form the metallic paste 55 into a first electrically conductive material 57. Hereinafter, the first electrically conductive material 57 is often referred to as a first electrical contact material. The firing is at a temperature of 1820° C. for 2 hours. After the sintering step a coating of a second electrically conductive material 100 is applied over the first electrically conductive material 57 to form a final electrical contact 105. The second electrically conductive material 100 can be silver, tin, zinc or gold, but gold is preferred, and can cover only the surface of the first electrical contact material 57 as shown in FIG. 2 or it can extend up the walls 70 of the pockets 50, as shown in FIG. 6.

The method of making a light-emitting diode light source 10 comprises the steps of forming a ceramic substrate 20 according to the method defined above and depositing an LED 110 on each of the final electrical contacts 105 and then wire-bonding suitable electrical connectors 120 between the LEDs 110 and the electrical contacts 105.

Figure 2:
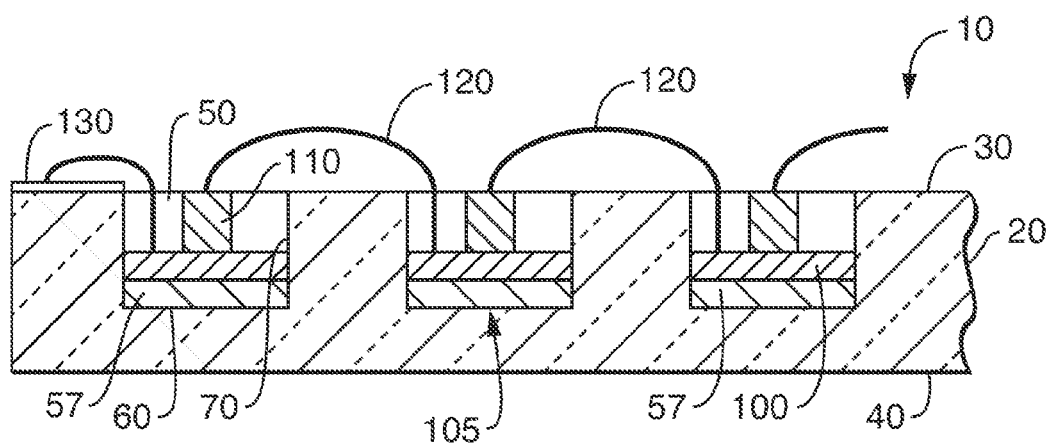
FIG. 2 is an enlarged sectional elevation view of an LED light source in accordance with an aspect of the invention.

An LED light source 10 is shown in sectional elevation in FIG. 2 and comprises a ceramic substrate 20 with first and second opposed surfaces 30, 40. Pockets 50 are formed in the first surface 30 and each of the pockets includes a bottom 60 and a sidewall or sidewalls 70. In the event that the pockets 50 are not circular, multiple walls 70 may be formed. A final electrical contact 105 comprised of the first electrically conductive material 57 with a coating of a second electrically conductive material 100 thereover is positioned in each of the pockets 50. An LED 110 is positioned in each of the pockets 50 and affixed to the electrical contact 105 and electrical connections 120, preferably in form of wire bonds, join the LEDs, the electrical connections 120 extending from a first LED 110 to an adjacent electrical contact 105.

This construction eliminates the previously needed complex conductive traces. Only two small conductive traces 130 (only one of which is shown in FIG. 2) are provided for connection to a power source, not shown.

The LED light source 10 can be used alone or as a principal part of an LED light 150.

Figure 4:
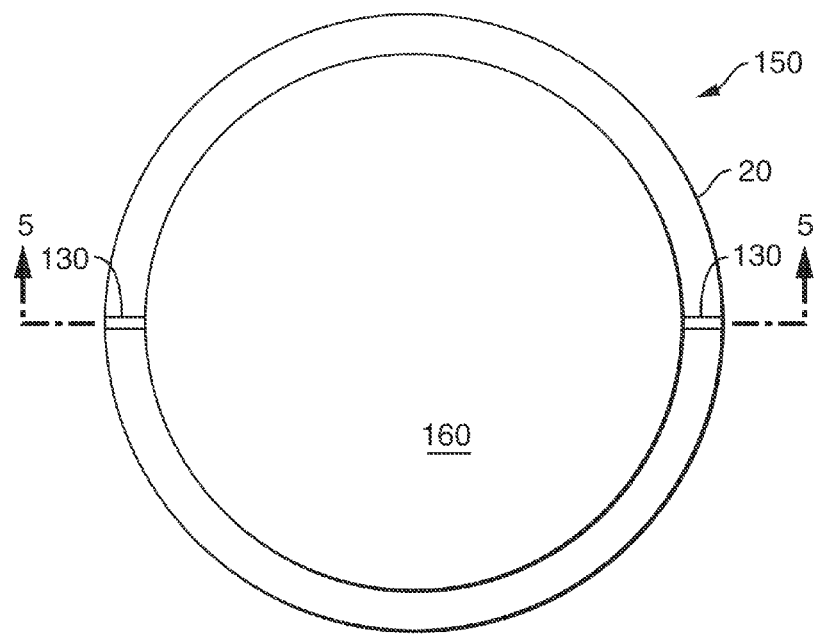
FIG. 4 is a plan view of a lamp in accordance with an aspect of the invention.
Figure 5:
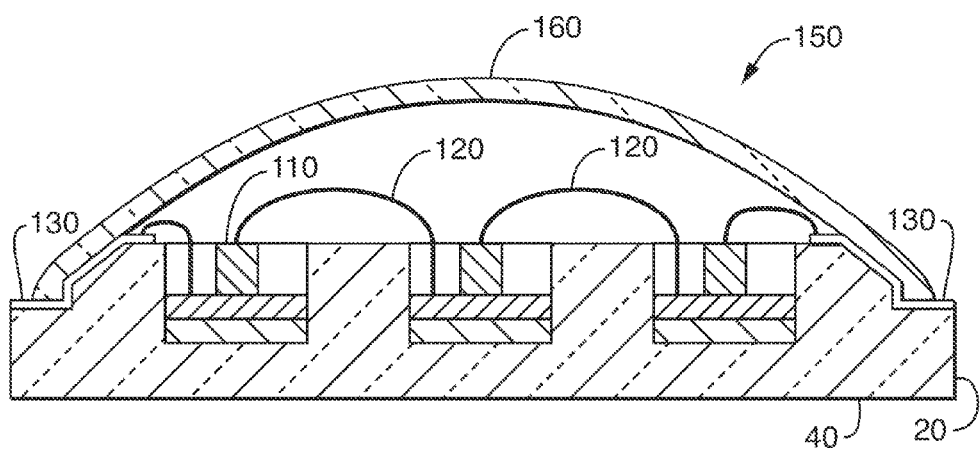
FIG. 5 is a sectional, elevation view taken along the line 5-5 of FIG. 4.

An LED light 150 utilizing the LED light source 10 comprises the LED-populated substrate 20 and a dome 160. The dome 160 comprises a suitable ceramic material such as PCA or AN having dispersed therein a phosphor that will emit light upon energization by the light emitted from the LEDs. Many commercial phosphor materials can be used so long as they can withstand the sintering temperatures need to form the dome; however, a suitable material for most applications is an yttrium aluminum garnet activated with cerium (YAG:Ce). The illuminating dome is formed from pellets or powder of the ceramic material, which is blended with the phosphor until a homogeneous mixture is obtained. This mixture is injection molded to the desired shape. As illustrated in FIGS. 4 and 5 that desired shape is hemispherical; however, other shapes can be employed. For example, a cylindrical body could have a sealed end that contained the phosphor.

In a particular embodiment of the invention the dome 160 was prepared by combining 150 grams of aluminum oxide powder having a particle size of 0.3 microns, 67 grams of YAG:Ce phosphor having a particle size of 2 microns, and 45 grams of a binder material, such as wax. After blending, the mixture was injection molded to shape and subsequently fired at 900° C. to remove the binder material. Subsequent to the binder removal, the dome 160 was fired at 1750° C. for 2 hours to sinter the dome.

After sintering, the dome 160 was applied to an LED light source 10 and affixed thereto, as by an appropriate cement, to form the LED light 150.

The LED light source 10, with 36 blue LEDs provided 466 lumens of illumination. With the dome 160 in place the total illumination was 2180 lumens. Red, Green or other color LEDs can also be use to change or supplement the emitted light spectrum of the LED source.

Thus there is provided a light emitting diode light source 10 or a light emitting diode light 150 that has excellent thermal conductivity and few electrical traces for connecting the LEDs. It is possible to manufacture the ceramic substrate 20 with multiple pockets and use only those desired, which can be a number far less than the total number. Because the LEDs are individually wired by wire bonds, there are no extraneous electrical traces that would have to be shorted out.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. An LED light source (10) comprising: a ceramic substrate (20) having first and second opposed surfaces (30, 40); a plurality of pockets (50) formed in said first surface (30), each of said pockets (50) including a bottom (60) and one or more side walls (70); an electrical contact (105) positioned in each of said pockets (50), said electrical contacts (105) comprising a quantity of a first electrically conductive material (57) and a layer of a second electrically conductive material (100) formed on said first electrically conductive material (57); an LED (110) positioned in at least some of said pockets (50) and affixed to said electrical contact (105), said one or more sidewalls surrounding said LED; and wire bond electrical connections (120) joining said LEDs (110), at least one of said wire bond electrical connections (120) extending from a first LED (110) to an adjacent electrical contact (105) in an adjacent pocket, wherein the LEDs are connected in series.

2. The LED light source (10) of claim 1 wherein said ceramic substrate is selected from aluminum oxide and aluminum nitride.

3. The LED light source (10) of claim 1 wherein said electrical contacts completely cover said bottom and said one or more side walls of said pockets.

4. An LED light (150) comprising: a circular ceramic substrate (20) having first and second opposed surfaces (30, 40); a plurality of pockets (50) formed in said first surface (30), each of said pockets (50) including a bottom (60) and one or more side walls (70); an electrical contact (105) positioned in each of said pockets (50), said electrical contacts (105) comprising a quantity of a first electrically conductive material (57) and a layer of a second electrically conductive material (100) formed on said first electrically conductive material (57); an LED (110) positioned in at least some of said pockets (50) and affixed to said electrical contact (105), said one or more sidewalls surrounding said LED; wire bond electrical connections (120) joining said LEDs (110), at least one of said wire bond electrical connections (120) extending from a first LED (110) to an adjacent electrical contact (105) in an adjacent pocket, wherein the LEDs are connected in series; and dome (160) positioned over the LEDs (110) of said LED light source (10), said dome (160) comprising a sintered mixture of a ceramic material and a phosphor energizable by the light emitted by the LEDs (110) when they are operating.

5. The LED light (150) of claim 4 wherein said electrical contacts completely cover said bottom and said one or more side walls of said pockets.

6. The LED light (150) of claim 4 wherein said ceramic material is selected from aluminum oxide and aluminum nitride.

7. The LED light (150) of claim 6 wherein said ceramic substrate is comprised of aluminum oxide or aluminum nitride.

8. The LED light (150) of claim 6 wherein said phosphor is YAG:Ce.

9. The LED light (150) of claim 8 wherein said ceramic material is aluminum oxide.

\* \* \* \* \*